United States Patent [19]
Ho

[11] Patent Number: 5,495,432
[45] Date of Patent: Feb. 27, 1996

[54] APPARATUS AND METHOD FOR SAMPLING RATE CONVERSION

[75] Inventor: Jyh-Chern Ho, Pan-chiao City, Taiwan

[73] Assignee: Industrial Technology Research Institute, Hsinchu, Taiwan

[21] Appl. No.: 177,008

[22] Filed: Jan. 3, 1994

[51] Int. Cl.⁶ .............................. G06F 17/14; H04J 1/02; H04J 3/22; H04B 1/66
[52] U.S. Cl. .................... 364/725; 375/122; 375/240; 370/70; 370/84
[58] Field of Search ................... 364/725, 726; 358/12, 13, 22; 375/122; 370/70, 84

[56] References Cited

U.S. PATENT DOCUMENTS

| | | | |
|---|---|---|---|
| 4,241,443 | 12/1980 | Sakaki et al. | 370/70 |
| 4,636,972 | 1/1987 | Boland | 364/724.18 |
| 4,870,661 | 9/1989 | Yamada et al. | 375/22 |
| 5,068,176 | 11/1991 | Takayama et al. | 358/13 |

*Primary Examiner*—Roy N. Envall, Jr.
*Assistant Examiner*—Emmanuel L. Moise
*Attorney, Agent, or Firm*—Bo-In Lin

[57] ABSTRACT

The present invention teaches a data processing system capable of performing a sampling frequency conversion. The data processing system includes a data receiving means for receiving a plurality of input data sampled at a first frequency. The data processing system further includes a discrete transforming means for performing a discrete transform on the input data at the first sampled frequency for transforming the input data to a discrete function in a second-variable-domain at the first sampling frequency. The data processing system further includes a convoluted inverse transforming means for inversely transforming the discrete function in a second-variable-domain back to the time domain at a second sampling frequency for converting the input data to a set corresponding data sampled at the second sampling frequency.

10 Claims, 9 Drawing Sheets

APPARATUS AND METHOD FOR SAMPLING RATE CONVERSION

BACKGROUND OF THE INVENTION

1. Field of the Invention

This invention relates generally to an apparatus and method for sampling rate conversion. More particularly, this invention relates to an apparatus and method for sampling rate conversion by the use of DFT and IDFT techniques which utilize the Chirp-Z transform method including a fast Fourier transform (FFT) for convolution computations whereby the complexity of the conversion is reduced to an order of O(N log N).

2. Description of the Prior Art

As there is an ever increasing need for applying the sampling rate conversion to various digital signal processing systems, such as the vocoders, digital waveform coding systems, digital audio systems, and various modulation systems, the technology of the sampling rate conversion is still limited by two major technical limitations. The first limitation is due to the fact that the traditional techniques for sampling rate conversion are limited to rate changes with factors which are decimated by integers or interpolation by integer factors. These techniques cannot be applied to some digital signal processing systems such as the pitch shifter of a high definition music synthesizer and various digital audio systems which may require 44.1K/48K or 32K/44.1K conversions. Second limitation arises when the sampling rate conversion algorithms based on a Shannon-Whittaker's interpolation formula is applied. The algorithms were proposed in attempt to overcome the first limitation. Due to the highly computational complexity, i.e., $O(N^2)$ and large database requirements, the proposed technique based on the Shannon-Whittaker's interpolation scheme is not suitable for real time applications and becomes impractical for implementation in modern systems which have urgent need for high speed, less complex apparatus and algorithms to perform the tasks of sampling rate conversion.

Traditional methods of sampling rate conversion generally requires the employment of interpolation to perform a conversion with a rational conversion factor of L/M where L and M are two integers. One of the common methods used consists the steps of inserting (L−1) zeros as the sampled values. The signals with the inserted zeros are processed with a up-sampled rate filter and decimated by rejecting all but every M-th sample. This method is not suitable for some digital audio systems. In the case of shifting the pitch in a music synthesis system, the A4 tone has the basic frequency of 440 Hz and A5 at 880 Hz. There are twelve semi-tones between A4 and A5. The frequency of each of these semi-tones can be obtained by the use of following formula:

$$f_i = 440 * 2^{(i/12)} \qquad (1)$$

In accordance with the Equation (1), when shifting a sampled signals representing an A4 tone to a A4-sharp, i.e., A#4, wherein i=1 in Equation (1), there is no rational number to represent the conversion factor of $2^{(1/12)}$ and the traditional rate conversion method is not suitable to perform the task required in such application.

For the purpose of illustrating the state of the art and to demonstrate the fact that there is a strong need for novel and improved sample rate conversion techniques to overcome these limitations, examples of two issued patents are reviewed herein. Yamada et al. disclose in U.S. Pat. No. 4,870,661 entitled "Sample Rate Conversion System, Having Interpolation Function" (Issued on Sep. 26, 1989), a sample rate conversion means for converting the sampled data at a first sampling rate to the data suitable to be used for a second system with a different sampling rate. The sample rate conversion means has an interpolation means to compute the interpolation coefficients which are then used by the interpolation means to to perform the interpolation task for converting the sampling rate. The interpolation coefficients are computed based on the phase relationship between the clock signals of the first and the second clock signals.

The sampling rate conversion means disclosed by Yamada et al. is particularly useful for processing video signals to be received and displayed on the television screen. The usefulness of this rate conversion means which uses an interpolation technique as disclosed in this patent however is not able to overcome the limitation that the conversion can only be performed based on a conversion ratio of a rational number. The interpolation means which computes the interpolation coefficients based on the phase relationship using the first and the second frequencies of the two system docks. The interpolation coefficient is then computed as the ratio of the time interval between the sampled data of the first frequency and the dock signal of the second system and the time interval between the next sampled data point with the next system clock of the second system. The interpolation coefficient is then used as a multiplier which is then provided to a filter to perform the rate conversion. For various modern applications, specifically, in the audio synthesis systems for pitch shifting, this interpolation is not suitable.

Takayama et al. discloses in another U.S. Pat. No. 5,068,716 entitled 'Sampling Rate Converter' (issued on Nov. 26, 1991) a sampling rate converter which is employed to convert an input video signal having an input sampling frequency to a second and different sampling frequency. An over-sampled technique is used wherein the input signals are over-sampled at a frequency which is an integral multiple of the input sampling frequency so as to generate zero values between data of the input signals. An interpolation is then performed on the over-sampled output signals. The interpolated signals are then decimated to generate the video signals with the desired second sampling rate. The video signals with the second sampling frequency is then filtered by a low pass filter to remove erroneous data caused by the sampling rate conversion.

Even that the sampling converter as disclosed by Takayama et al. provides a converter which is relatively simpler in its circuit architecture and still capable of providing adequate accuracy for the purpose of video signal processing, however, like the converter disclosed by Yamada et al., this patent is restricted by the same limitation. The conversion can only be performed for a rational factor. Additionally, the multi-stages of circuits which are required for performing the tasks of interpolation, decimation and filtering impose a great demand on the IC chip areas thus may often limit the application of this rate conversion devices to larger and more expensive systems. Broad application of a low cost and miniaturized sampling rate converter suitable for more common use by the consumer electronics products and the portable communication systems would therefore be greatly restricted.

The aforementioned difficulties and limitations are further compounded by the fact that a device designer of the conventional sampling rate conversion apparatus is provided with little flexibility due to the limitation imposed by the interpolation operations. The circuit architecture and functions performed therein are well defined. With the system speed requirements, the designer often is required to apply a multi-stage structure as that disclosed in the techniques disclosed by Takayama and Yamada. This lack of design flexibility further restricts the sampling conversion devices from being optimized for different types of applications with broader range of design complexity, manufacture costs, size and performance levels.

Therefore, there is still a need in the art of sampling rate conversion to provide an apparatus and algorithm such that the conversion process can be flexibly performed for frequency shifting wherein the rates of conversion are not rational numbers. Furthermore, the task of conversion must be expeditiously performed with high speed in order to satisfy the real time data processing requirements. Meanwhile, in order to apply the IC technology to fabricate the conversion devices, the circuit configuration of the converter for implementing the algorithm must be simple, small in size and easy to design and manufacture such that the conversion devices can be broadly and economically applied to a wide variety of modern electronics and communication systems.

SUMMARY OF THE PRESENT INVENTION

It is therefore an object of the present invention to provide a sample rate conversion apparatus and method to overcome the aforementioned difficulties encountered in the prior art.

Specifically, it is an object of the present invention to provide a sample rate conversion apparatus and method wherein a conversion with a conversion factor of non-rational number can be performed whereby the conversion devices can be more broadly utilized to the audio application and other fields wherein non-rational ratio of rate conversions are required.

Another object of the present invention is to provide a sampling rate conversion apparatus and method wherein a technique of scale change of a bud-limited continuous function is used such that the computational complexity can be reduced and real time application can be more expeditiously implemented.

Another object of the present invention is to provide a sampling rate conversion apparatus and method wherein a technique of scale change of a band-limited continuous function is used such that the circuit designers are provided with greater flexibility to implemented the algorithms by hardware or software means allowing great deal of adjustments for speed, IC circuit areas, accuracy and other design factors to optimally achieve the design objectives.

Another object of the present invention is to provide a sampling rate conversion apparatus and method wherein a technique of scale change of a band-limited continuous function is used such that the user of the conversion apparatus is free to choose different kinds of smoothing windows such that convergence performance can be improved.

In summary, this invention discloses an apparatus and method for sampling rate conversion by the use of DFT and IDFT techniques which utilize the Chirp-Z transform method including a fast Fourier transform (FFT) for convolution computations whereby the complexity of the conversion is reduced to an order of O(N log N).

Briefly, in a preferred embodiment, the present invention comprises a data processing system ,capable of performing a sampling frequency conversion. The data processing system includes a data receiving means for receiving a plurality of input data sampled at a first frequency. The data processing system further includes a discrete transforming means for performing a discrete transform on the input data at the first sampled frequency for transforming the input data to a discrete function in a second-variable-domain at the first sampling frequency. The data processing system further includes a convoluted inverse transforming means for inversely transforming the discrete function in a second-variable-domain back to the time domain at a second sampling frequency for converting the input data to a set corresponding data sampled at the second sampling frequency.

It is an advantage of the present invention that it provides a sampling rate conversion apparatus and method wherein a conversion with a conversion factor of non-rational number can be performed whereby the conversion devices can be more broadly utilized to the audio application and other fields wherein non-rational ratio of rate conversions are required.

Another advantage of the present invention is that it provides a sampling rate conversion apparatus and method wherein a technique of scale change of a band-limited continuous function is used such that the computational complexity can be reduced and real time application can be more expeditiously implemented.

Another advantage of the present invention is that it provides a sampling rate conversion apparatus and method wherein a technique of scale change of a band-limited continuous function is used such that the circuit designers are provided with greater flexibility to implemented the algorithms by hardware or software means allowing great deal of adjustments for speed, IC circuit areas, accuracy and other design factors to optimally achieve the design objectives.

Another advantage of the present invention is that it provides a sampling rate conversion apparatus and method wherein a technique of scale change of a band-limited continuous function is used such that the user of the conversion apparatus is free to choose different kinds of smoothing windows such that convergence performance can be improved.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

A unique approach taken by this invention in converting the sampling rate from a first sampling frequency $R_1$ to a second frequency $R_2$ is based on the following assumptions that: 1). the first set of sampled data $f_i$, i=1, 2,3, ... M obtained at a first sampling rate, i.e., $R_1$ per second, are discrete values, i.e., $f(t_i)$, of a band-limited continuous function f(t) measured at each sampling time $t_i$. Therefore it is assumed that f(t) is a band-limited continuous function of time and $t_i$ is the time when the sampled value $f_i$ is measured, i.e., $$f_i = f(t_i) \quad (2)$$

2) In converting the sampling data $f_i$, i=1, 2,3, ... M obtained at the first sampling rate $R_1$ to a second set of sampled data, i.e., $f'_j$, j=1, 2,3, ... M', obtained at a second sampling frequency $R_2$, the second set of sampled data $f'_j$, j=1, 2,3, ... M' are discrete functional values of the same band-limited continuous function f(t) except now they are measured at different time with different measurement frequency, i.e., $$f'_j = f(t'_j) \quad (3)$$

where the measurement time $t'_j$ are determined by a different sampling frequency $R_2$. With these two basic assumptions, mathematically it can be demonstrated that once a set of first sampled data, i.e., $f_i$, i=1, 2,3, ... M, are known, a functional correlation, such as $G(f_i, R_1, R_2)$, between the first set of sampled data and the second set of sampled data can be developed, i.e., $$f(t'_j) = f(t_i) G(f_i, R_1, R_2) \quad (4)$$

This functional correlation can thus be utilized to perform the sampling rate conversion. A novel technique utilized in this invention is to apply discrete Fourier transfer (DFT) and inverse discrete Fourier transfer (IDFT) on the first set of sampled data to develop a correlational function $G(f_i, R_1, R_2)$. This correlational function, i.e., $G(f_i, R_1, R_2)$ can then be applied to perform the sampling rate conversion with great deal of flexibility to achieve different levels of accuracy, speed and computational complexity. Since these two basic assumptions would generally be true for most of situations where the data are sampled in one frequency then to be used at a different frequency, the technique taught by this invention would have broad applications in almost all circumstances where sampling rate conversion is required.

The mathematical formulation in deriving a correlational function $G(f_i, R_1, R_2)$ can be best understood by first reviewing a Fourier and an inverse Fourier transfer operations:

$$F(\omega) = \int_{-\infty}^{\infty} f(t) e^{-j\omega t} dt \quad (5)$$

$$f(t) = (1/2\pi) \int_{-\infty}^{\infty} F(\omega) e^{j\omega t} d\omega \quad (6)$$

Equations (5) and (6) can be reformulated as:

$$F(\omega_1) = \int_{-\infty}^{\infty} f(t) e^{-j\omega_1 t} dt \quad (7)$$

$$\begin{aligned} g(t) &= (1/2\pi) \int_{-\infty}^{\infty} F(\omega_1) e^{j\omega_2 t} d\omega_2 \\ &= (k/2\pi) \int_{-\infty}^{\infty} F(\omega_1) e^{j\omega_1(kt)} d\omega_1 \\ &= kf(kt) \end{aligned} \quad (8)$$

Where $k = \omega_1/\omega_2$

Where Equation (7) is a convoluted inverse transform equation, i.e., the integration is performed over the second frequency to perform an inverse Fourier transform on the frequency domain function of obtained from the first time domain function in Equation (6). Hence from Equation (7):

$$f(kt) = (1/2\pi k) \int_{-\infty}^{\infty} F(\omega_1) e^{j\omega_2 t} d\omega_2 \quad (9A)$$

$$= (1/2\pi k)(\omega_1/\omega_2) \int_{-\infty}^{\infty} F(\omega_1) e^{j\omega_2 t} d\omega_2 \quad (9B)$$

A function of time, i.e., f(t), represented by the sampled data measured at a first frequency, i.e., $(2\pi/\omega_1)$, can now be converted to a frequency shifted function f (kt). The frequency shifted function f(kt) can also be represented by a correlational function in terms of the convoluted inverse Fourier transform on the frequency domain function of the first frequency, i.e., $F(\omega_1)$, of the band-limited continuous function f(t).

For the purpose of applying the above algorithm to the discrete sampled data, instead of employing the regular Fourier transform and the inverse transform operations in their continuous analog forms as shown in Equation (9A) and (9B), similar mathematical formulations can be developed by the use of the discrete Fourier transform (DFT) and the inverse DFT (IDFT). In applying the DFT and IDFT to the sampled sampled value f(n) from a band-limited signal f(t), the discrete Fourier transform (DFT) formula is:

$$F(k) = \sum_{n=0}^{N-1} f(n) W_1^{-nk} \quad (10A)$$

where N is an integer representing the number of the sampled data f(n), $W_1 = e^{j(2\pi/N)}$, and k=−(n−1)/2, ... , (N−1)/2, and $$g_p = (1/N) \sum_{k=-(N-1)/2}^{(N-1)/2} F(k) W_2^{pk} \quad (10B)$$

where $W_2 = W_1^{(1/m)}$, and $m = \omega_1/\omega_2 = f_2/f_1$ which is a ratio of the sampling frequency between the sampled data $g_p$ and $f(n)$ which can be any positive real number while $n = 0, 1, 2, \ldots, N-1$.

The values of p in Equations (10B) which is the total number of the sampled data at the new sampling frequency $f_2$, is $\{m(Tn+L)\}$ where $\{K\}$ represents the integer value of K which is smaller or equal to K.

Furthermore, the symbol L represents the length of the data segment which is the length of the DFT, and where $T_1 = 0$, and $$T_n = (1/m)\{m(T_{n-1}+N) - m(T_{n-1}+N)\} \quad (11)$$

which is the remaining interval of the (n+1)th data segment after re-sampling at the new sampling rate.

Figure 1:
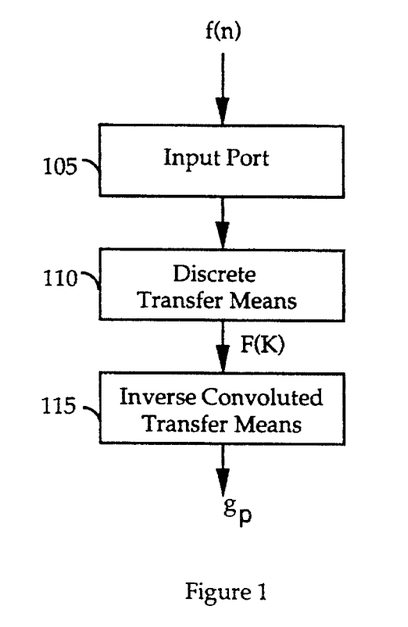
FIG. 1 is a functional block diagram of a sampling rate conversion system in accordance with the present invention.

Equation (10B) provides the required inverse convoluted transforms for converting sampling rate. The conversion process performed by either Equations (10A) and (10B) represent a scale change of a band-limited continuous function $f(t)$. FIG. 1 shows a block diagram of a data processing system 100 capable of performing the sampling rate conversion according to the present invention. The data processing system 100 includes an input port 105 to receive a plurality of data sampled at a first frequency. The data processing system further includes a discrete transforming means 110 for performing a discrete transform on the input data at the first sampled frequency for transforming the input data to a discrete function in a second-variable-domain. The data processing system 100 further includes a convoluted inverse transforming means 115 for inversely transforming the discrete function in a second-variable-domain back to the time domain over a second frequency thus converting the input data to a set corresponding data sampled at the second sampling rate.

Figure 2:
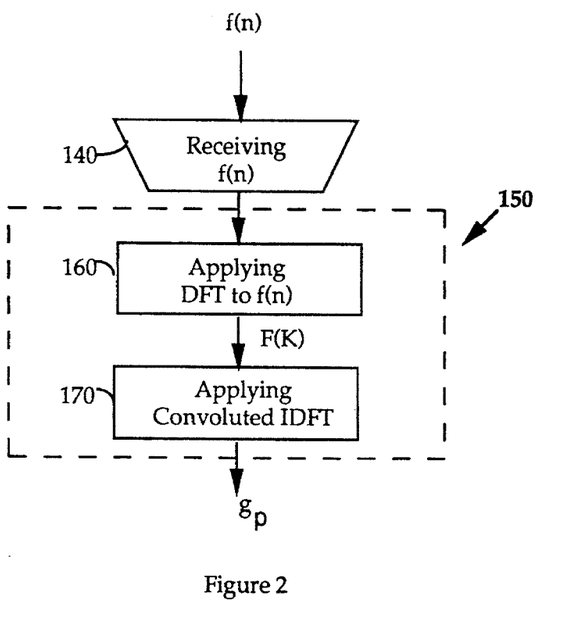
FIG. 2 is a functional block diagram of another sampling rate conversion system in accordance with the present invention.

FIG. 2 illustrate the functional steps employed by this invention for conversion of a plurality of data obtained at a first sampling rate to a second sampling rate. The method includes a step (step 140) of receiving a plurality of input data sampled at the first frequency. It further includes a step (step 150) of performing a scale change from the first sampling rate to the second sampling rate by assuming that the plurality of sampled data represent a band-limited continuous function. The step of performing the scale change further includes a first step (step 160) of applying a DFT to the sampled data to obtain a plurality of frequency-domain sample data and then a second step (step 170) of applying a convoluted IDFT to transform the frequency-domain sampled data to a set of corresponding time-domain data at a second sampling frequency.

This invention thus discloses a data processing system 100 which is capable of performing a sampling frequency conversion. The data processing system includes a data receiving means 105 for receiving a plurality of input data sampled at a first frequency. The data processing means 100 further includes a discrete transforming means 110 for performing a discrete transform on the input data at the first sampled frequency for transforming the input data to a discrete function in a second-variable-domain at the first sampling frequency. The data processing system 100 further includes a convoluted inverse transform means 115 for inversely transforming the discrete function in a second-variable-domain back to the time domain at a second sampling frequency for converting the input data to a set of corresponding data sampled at the second sampling frequency. In one preferred embodiment, the data processing system 100 includes a discrete transform means 110 which is a discrete Fourier transform (DFT) means, and the convolute inverse transform means is a convolute inverse discrete Fourier transform (IDFT) transform means. In another preferred embodiment, the data processing system 100 includes a DFT transform means and a convolute IDFT transform means which performs the DFT and the IDFT by using Equations 10A and 10B respectively.

This invention also discloses a method for sampling rate conversion which comprises the steps of (a) receiving a plurality of input data sampled at a first frequency (step 140); (b) performing a scale change from the first sampling frequency to a second sampling rate by assuming that the plurality of sampled data represent a band-limited continuous function (step 150). In a preferred embodiment, this invention discloses a method for sampling rate conversion as described above wherein step (b) further includes the steps of (b1) applying a DFT at the first sampling frequency to the input data to obtain a plurality of frequency-domain discrete functions (step 160); and (b1) applying a convoluted IDFT to transform the frequency-domain discrete functions at the first sampling frequency to a set of corresponding time-domain data at a second sampling frequency (step 170).

Figure 3A:
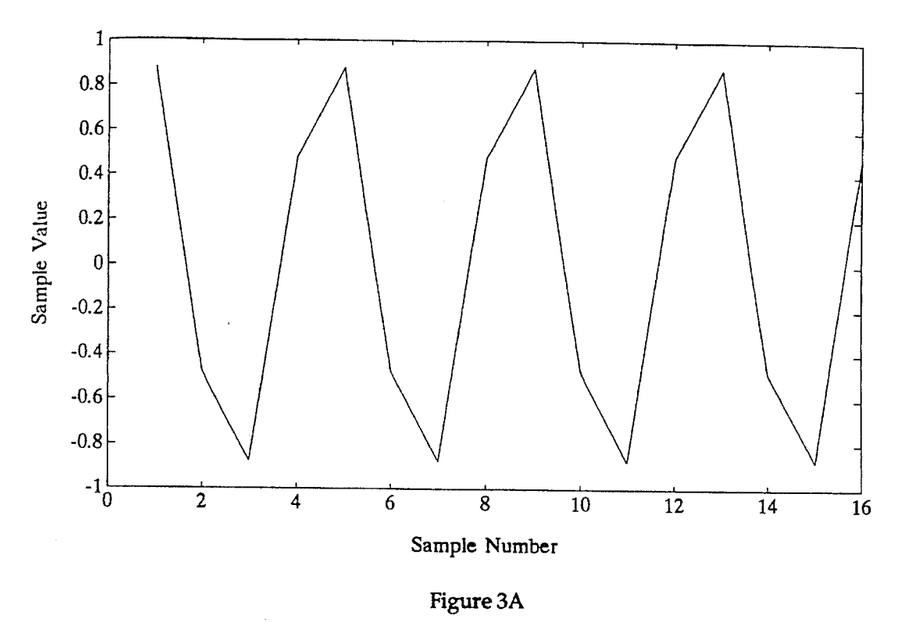
FIG. 3A is plot of the sampled data over time for a band limited function SIN($2\pi n/4+0.5$)
Figure 3B:
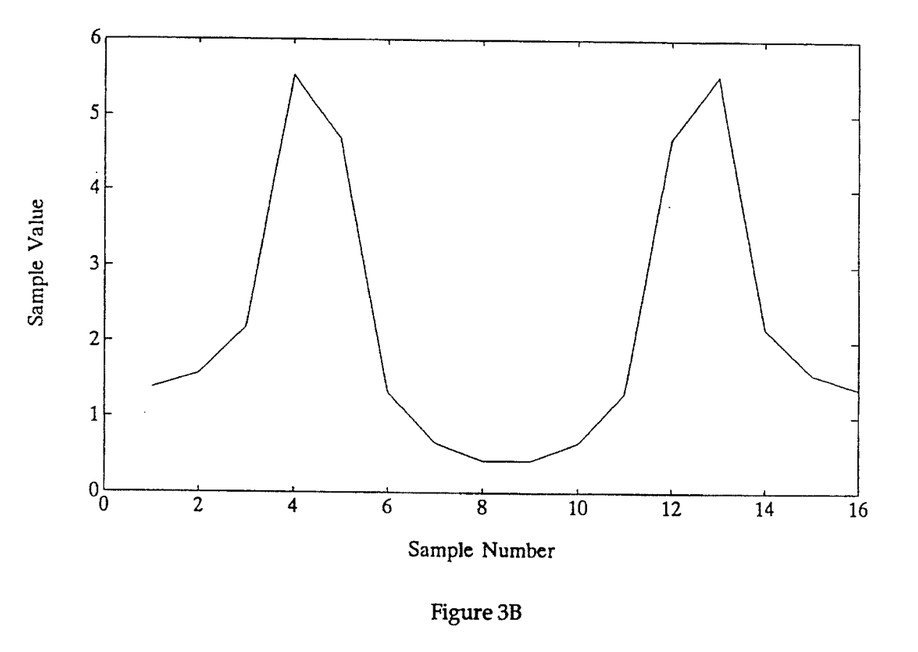
FIG. 3B is a plot of the discrete Fourier transform of the data sequences of FIG. 3A.
Figure 3C:
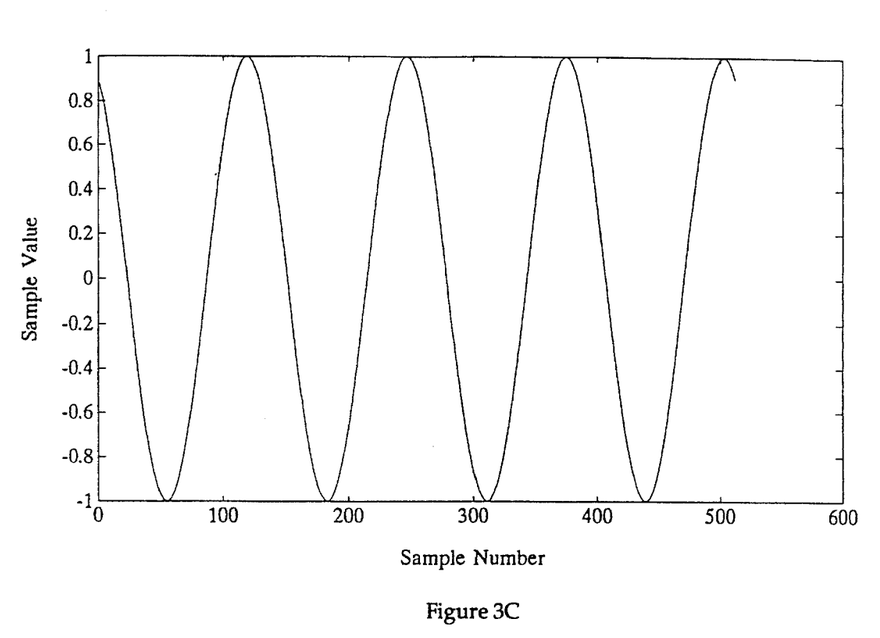
FIG. 3C is a plot of the sampling data over time after a conversion ratio of 32 is applied according to the techniques of this invention.
Figure 3D:
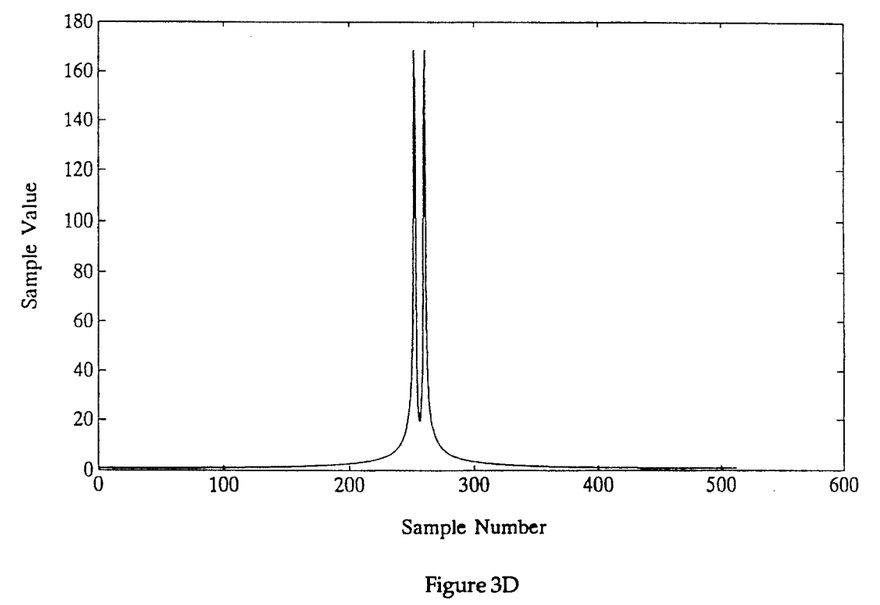
FIG. 3D is the resulting DFT of the function sampled at the new sampling rate as shown in FIG. 3C.

FIGS. 3A to 3D show an example to further describe the operation of the rate conversion apparatus and method. A band limited sampling data:

$$f(n) = SIN[(2p \, n0/4 + 0.5] \quad (12)$$

Where n=16 over four periods are plotted in FIG. 3A and the DFT transform of f(n), i.e., F(K), is plotted in FIG. 3B. A conversion ratio of 32, i.e., to convert the sampling rate to p=512, i.e., 16 multiplied by 32, is applied to the sampled data f(n) by the use of Equations 10(A) and 10(B). The sampled data $g_p$ is plotted in FIG. 3C and the resulting DFT of the function sampled at the new sampling rate, i.e., 512, is shown in FIG. 3D.

Figure 4A:
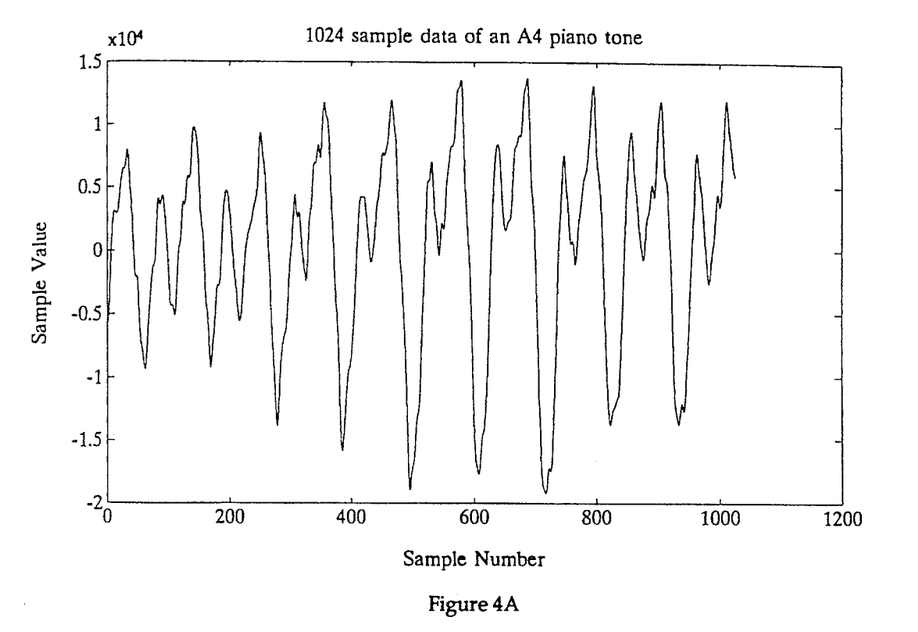
FIG. 4A shows 1024 sampled data of an A4 piano tone with the basic frequency of 440 Hz.
Figure 4B:
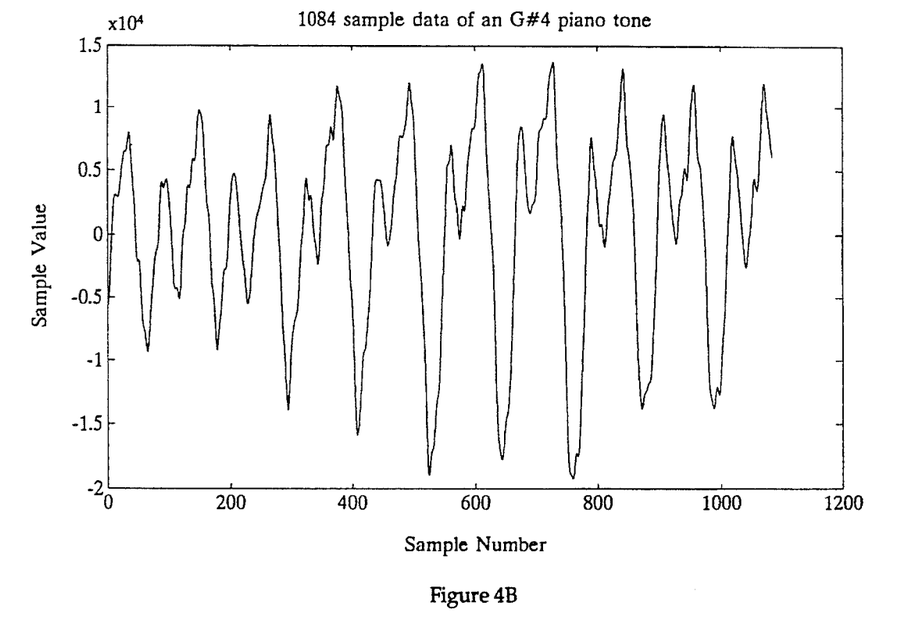
FIG. 4B shows the 1084 sampled data after the sampled data of FIG. 4A are converted by the sampling rate conversion system of FIG. 1.
Figure 4C:
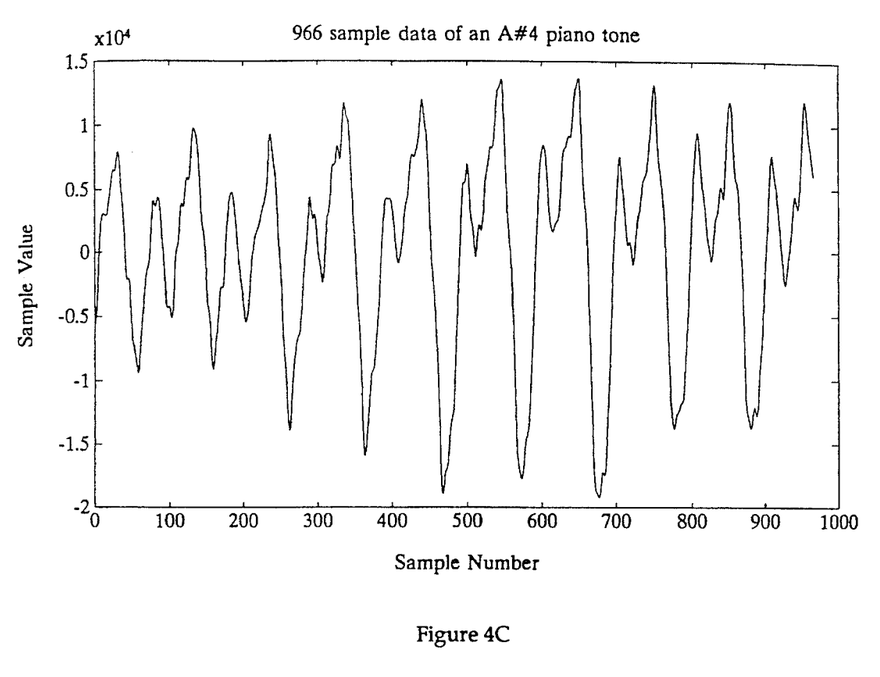
FIG. 4C shows the 966 sampled data after the sampled data of FIG. 4A are converted by the sampling rate conversion system of FIG. 1.

FIG. 4A to 4C show effects of a pitch shifter for a music synthesizer system employing a sampling rate conversion system 100 as shown in FIG. 1 which uses the non-rational number sampling conversion factor as taught by this invention. FIG. 4A shows 1024 sampled data of an A4 piano tone with the basic frequency 440 Hz which are inputted to the input port 105. In order to shift to a different tone, e.g., G#4 $(440*2^{-1/12}=415.30 \text{ Hz})$ or A4# $(440*2^{1/12} =466.164 \text{ Hz})$ the sampling rate of the A4 tone can be changed by a factor of $2^{-1/12}$ and $2^{1/12}$ respectfully. FIGS. 4B and 4C show the 1084 $(1024*2^{1/12})$ and 966 $(1024*2^{-1/12})$ sampled data respectfully after being processed by the sampling rate conversion system 100 by applying a conversion factor of $2^{1/12}$ and $2^{-1/12}$ respectively.

The DFT and the convoluted IDFT operations employed for sampling rate conversion can be further developed into several data processing stages in order to simplify the implementation and to increase the speed and the accuracy of the sampling rate conversion by further utilizing data processing techniques suitable for the processes performed in each specific stage.

For the purpose of simplifying and decomposing the operations of transforming and convoluted-inverse-transforming into several stages, a chirp transform technique is applied. The chirp transform is most effective to perform the convolution computation for the sampled data obtained from measurements on systems which generate fixed pre-specified impulse responses. The chirp transform is also very flexible to be applied to any set of equal spaced samples of the Fourier transform on the unit circle. However, it should be noted that the chirp transform is only provided here as one specific preferred embodiment. Any DFT and IDFT evaluation techniques can be applied to Equations 10(A) and (B) for the purpose of performing the sample rate conversion.

The Equations (10A) and (10B) can be reformulated by utilizing the functional relation that:

$$nK = (1/2)[n^2 + k^2 - (n-K)^2] \quad (13)$$

$$F(k) = \sum_{n=0}^{N-1} f_n W_1^{nk} \quad (14)$$

$$= \sum_{n=0}^{N-1} W_1^{-(n*n)/2} f_n W_1^{(1/2)(k-n)2} W_1^{-k*k/2}$$

where $k = -(N-1)/2, \ldots, (N-1)/2$. By noting that $$g_p = f(n) W_1^{-(n*n)/2} \quad (15)$$

Equation (14) can be reformulated as:

$$F(K) = W_1^{-k*k/2} \left[ \sum_{n=0}^{N-1} g_p W_1^{(1/2)(k-n)2} \right] \quad (16A)$$

$$= W_1^{-k*k/2} [g_p * W_1^{(n*n/2)}] \quad (16B)$$

Where the "*" in Equation (16B) denotes a convolution operation and $$k = -(n-1)/2, \ldots, (n-1)/2$$

Figure 5:
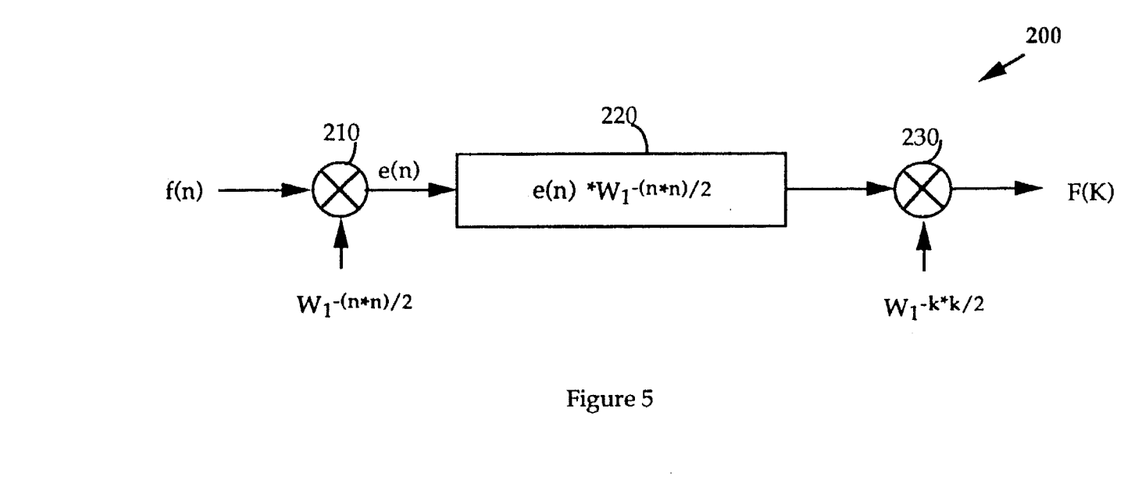
FIG. 5 is a block diagram showing a convolution process performed by the DFT means for the sampling rate conversion system of FIG. 1.

In the form of Equation (16), F(K) corresponds to the convolution of the sequence $g_p$ with the sequence $W_1^{(n*n/2)}$. The output sequence, indexed on the independent variable K, is the sequence of frequency samples F(K). FIG. 5 shows a block diagram for a DFT transforming means 200 wherein the sampled input f(n) is inputted to a first multiplication means 210 to generate an input e(n) to a first convolution means 220 wherein a convolution computation $[e(n)*W_1^{-(n*n)/2}]$ is performed. The output from the convolution means 220 is then processed by a second multiplication means 230 wherein the output from the convolution means 220 is then multiplied by $W_1^{-k*k/2}$ to compute the final output F(K). The convolution means 220 performs a computation such that:

$$e(n) * W_1^{n*n/2} = \sum_{n=0}^{N-1} e(n) W_1^{(1/2)(k-n)2} \quad (17)$$

Hence, $$F(K) = \left[ \sum_{n=0}^{N-1} f_n W_1^{n*n/2} W_1^{(1/2)(k-n)2} \right] W_1^{-k*k/2} \quad (18)$$

Therefore, the convolution in Equation (17) can be evaluated by FFT with computation complexity O(NlogN).

Similarly, Equation (10B) may be written as:

$$g_p = (1/N) \sum_{k=-(N-1)/2}^{(N-1)/2} W_2^{(K*K)/2} F(k) W_2^{(1/2)(p-k)(p-k)} W_2^{(p*p)/2} \quad (19)$$

Figure 6:
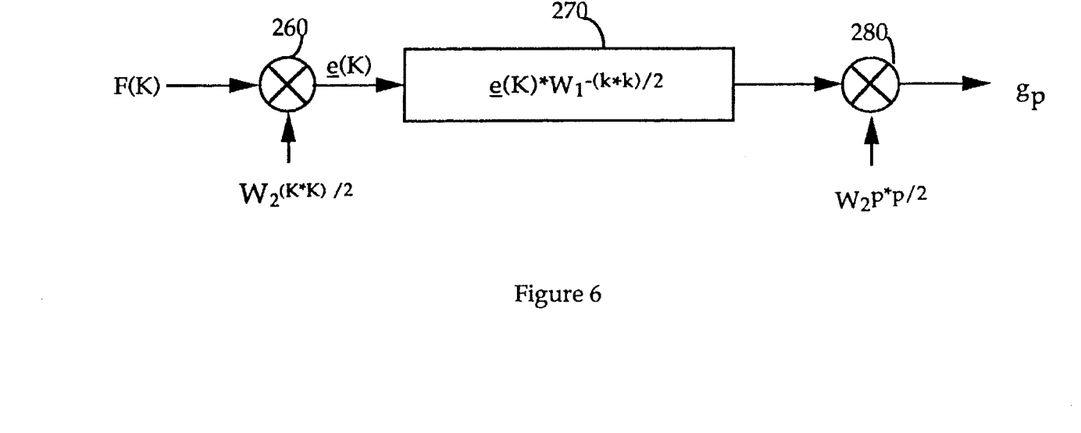
FIG. 6 is a block diagram showing a convolution process performed by the IDFT means for the sampling rate conversion system of FIG. 1.

FIG. 6 shows a block diagram for an IDFT transforming means 250 wherein the sampled input F(K) is inputted to a first multiplication means 260 for multiplying to $W_2^{(K*K)/2}$ to generate an input e(K) for inputting to a first convolution means 270 wherein a convolution computation $e(K)*W_1^{-(k*k)/2}$ is performed. The output from the convolution means 270 is then processed by a second multiplication means 280 wherein the output from the convolution means 270 is then multiplied by $W_2^{p*p/2}$ to compute the final output $g_p$. The convolution means 270 performs a computation such that:

$$\underline{e}(k) * W_2^{-k*k/2} = (1/N) \sum_{k=-(n-1)/2}^{(N-1)/2} \underline{e}(k) W_2^{(1/2)(p-k)2} \quad (20)$$

$$= (1/N) \sum_{k=-(n-1)/2}^{(N-1)/2} e(k) W_2^{(1/2)(p-k-(n-1)/2)2}$$

Wherein e(k) is a computed by shifting the index k' of the function e(k') by (N−1)/2. Hence the a sequence of correlations, i.e., $$e(0) = e[-(N-1)/2] \quad (21A)$$

$$e(1) = e[-(N-1)/2 + 1] \quad (21B)$$

$$\ldots$$

$$e(N-1) = e[(N-1)/2] \quad (21C)$$

are established. Furthermore, by using the equivalence relationship that:

$$[p-k-(N-1)/2]^2 = (p-N)^2 - (N-1)(p-k) + (N-1)^2/4 \quad (22)$$

Hence, $$g_p = \left[ (1/N) \sum_{k=0}^{N-1} e(k) W_2^{-(1/2)(p-k)2} W_2^{(1/2)(p-k)(N-1)} W_2^{(1/8)(N-1)2} \right] W_2^{p*p/2} \quad (23)$$

Figure 7:
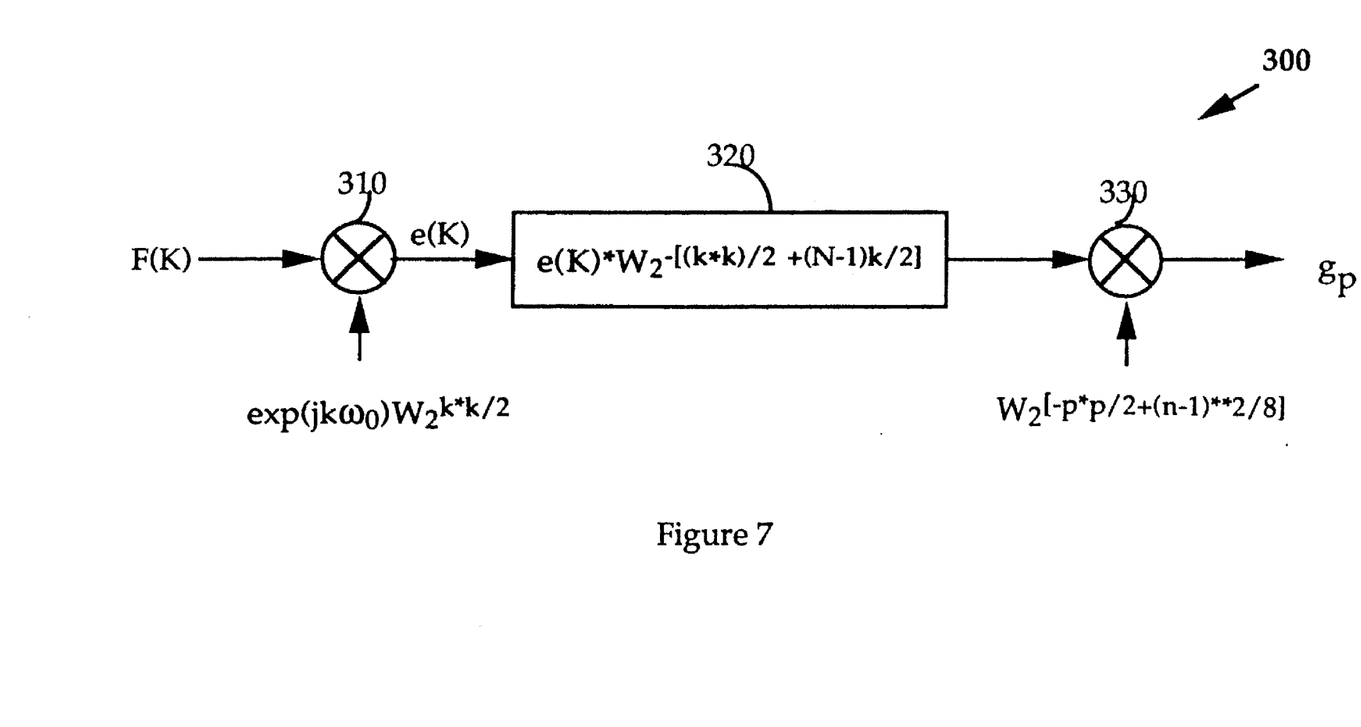
FIG. 7 is a block diagram showing a convolution process for a remainder data segment which is performed by the IDFT means for the sampling rate conversion system of FIG. 1.

While the sequence F(k) is re-sampled to become the sequence $g_p$, there may be a remaining time interval. By taking into account of this remaining time interval, FIG. 7 shows the operations performed according to Equation (23). FIG. 7 shows a block diagram for an IDFT transforming means 300 wherein the sampled input F(K) is inputted to a first multiplication means 310 to generate an input e(K) by multiplying with $\exp(jk\omega_0)W_2^{k*k/2}$ where $\omega_0$ is $2\pi f T_{k+1}$, for inputting to a first convolution means 320 wherein a convolution computation $e(K)*W_2^{-[(k*k)/2+(N-1)k/2]}$ is performed. The output from the convolution means 320 is then processed by a second multiplication means 330 wherein the output from the convolution means 320 is then multiplied by $W_2^{[-p*p/2+(n-1)**2/8]}$ to compute the final output $g_p$. Since the convolution in Equation (23) as performed by the convolution means 330 can also be evaluated by FFT, the computation complexity is O(NlogN).

Further processes can be employed in the above sampling rate conversion method to improve the convergence performance. Equations 10A and 10B can also be expressed as:

$$F(k) = \sum_{n=0}^{N-1} f(n) e^{-j(2\pi/N)nk} \quad (24)$$

where $n = -(N-1)/2, \ldots, (N-1)/2$, and $$g_p = (1/N) \sum_{k=-(N-1)/2}^{(N-1)/2} F(k) W_2^{pk} \quad (25)$$

$$= (1/N) \sum_{k=-(N-1)/2}^{(N-1)/2} \left[ \sum_{n=0}^{N-1} f_n e^{-j(2\pi/N)nk} \right] e^{-j(2\pi/N)(pk/m)}$$

$$= (1/N) \sum_{n=0}^{N-1} f_n \left[ \sum_{k=-(N-1)/2}^{(N-1)/2} e^{-j(2\pi/N)nk} \right] e^{-j(2\pi/N)(pk/m)}]$$

$$= (1/N) \sum_{n=0}^{N-1} f_n \left[ \sum_{k=-(N-1)/2}^{(N-1)/2} e^{-j(2\pi k/N)(n-p/m)} \right]$$

$$= (1/N) \sum_{n=0}^{N-1} f_n [\sin \pi(n - p/m)/\text{SIN}(\pi/N)(n - p/m)]$$

From Equation (25), the new sampled data $g_p$ is a convolution of the original sampled data $f_n$ and the 'truncated rectangular windows'. As it is well known that the the truncated rectangular function generally has poor convergence performance, a technique of smoothing window is applied to improve the convergence performance. Let the desired smoothing window be represented by $H(\omega)$ and the transient response be $h(t)$, according to the convolution theorem:

$$F(\omega)H(\omega) = \int_{-\infty}^{\infty} [f(t) * h(t)] e^{-j\omega t} dt \qquad (26)$$

From Equations (5) and (26) we derive $$(1/2k\pi) \int_{-\infty}^{\infty} F(\omega_1)H(\omega_1) e^{-j\omega_2 t} d\omega_2 \qquad (27)$$

$$= (1/2k\pi) \int_{-\infty}^{\infty} \int_{-\infty}^{\infty} [f(t) * h(t) e^{-j\omega_1 t} dt \, e^{-j\omega_2 t} d\omega_2 \qquad (28)$$

$$= f(kt) * h(kt)$$

Hence:

$$g_p = (1/2k\pi) \int_{-\infty}^{\infty} F(\omega_1)H(\omega_1) e^{-j\omega_2 t} d\omega_2 \qquad (29)$$

and $$g_p = (1/N) \sum_{k=-(N-1)/2}^{(N-1)/2} H(k) \left[ \sum_{n=0}^{N-1} f_n W_1^{-nk} \right] W_2^{pk} \qquad (30)$$

Where $k = -(N-1)/2, \ldots, (N-1)/2$ and the smoothing window $H(\omega)$ can be Hamming, Hanning, Butterworth, Kaiser, Chebyshev, Papoulis or any other types of windows. The smoothing window can be generally implemented as a symmetric low-pass filter, the accuracy of the method according to the present invention can be improved by increasing the sampled data length N. Additionally, the well known technique of data overlapping can also be applied for improving the accuracy of the sampling rate conversion.

Figure 8:
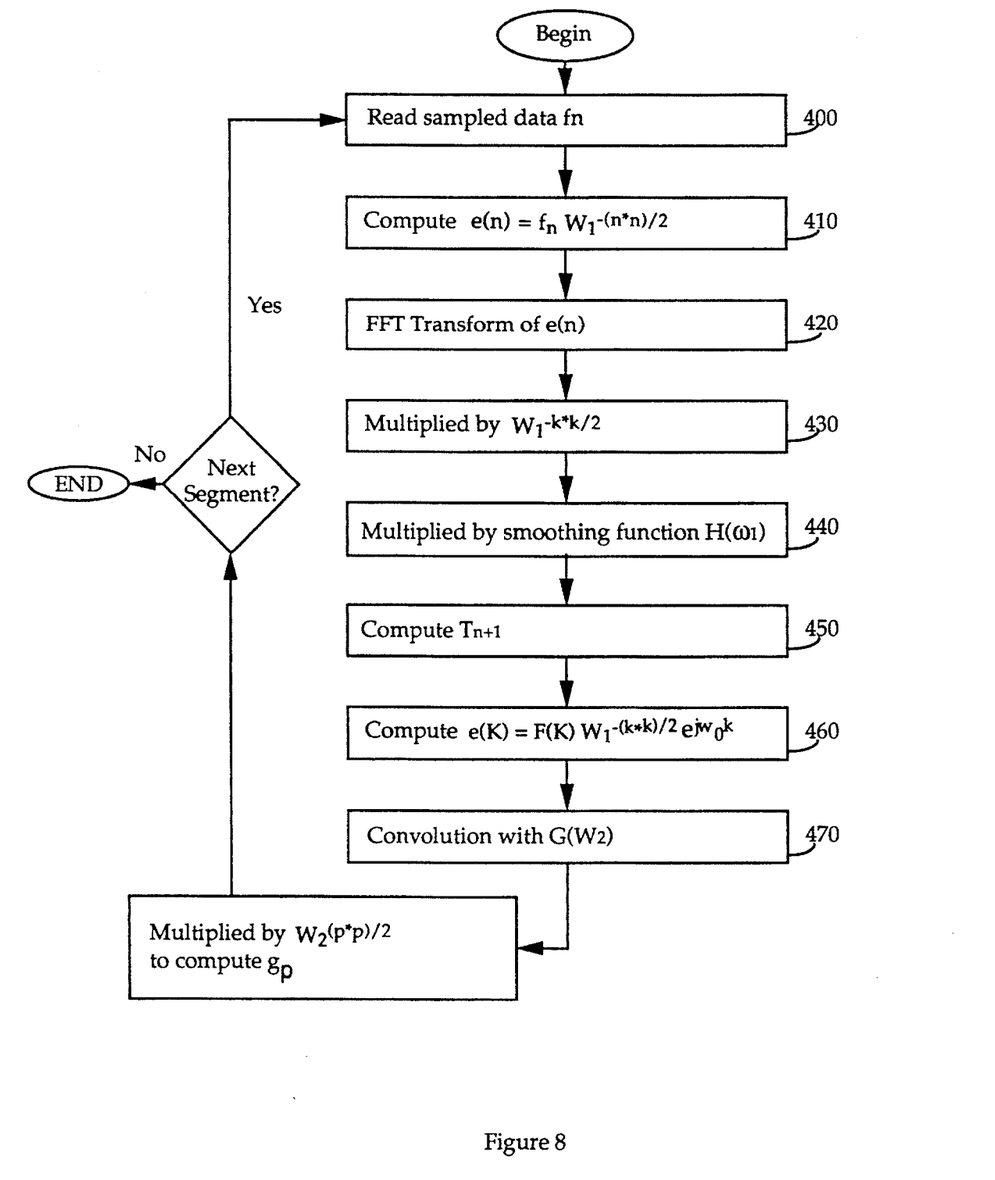
FIG. 8 is a flow chart showing all the functional steps performed by the sampling rate conversion system of FIG. 1.

Referring to FIG. 8 which is a flow chart summarizing the above procedures by showing all the steps in performing the task of frequency conversion according to the present invention. The process begins with the reading of a sequence of sampled data $f_n$ (step 400) where $n = 1, 2, 3, \ldots, N$. A function $e(n)$ is calculated (step 410) where $e(n) = f_n W_1^{-(n*n)/2}$ and $n = 1, 2, 3, \ldots, N$. Then a fast Fourier transform (FFT) is applied to compute the convolution of $e(n) * W_1^{n*n/2}$ according to Equation 17 (step 420). The result obtained from the step 420 is then multiplied by $W_1^{-k*k/2}$ according to Equation 18 (step 430). The product obtained from the step 430 after the multiplication is then multiplied to a smooth function $H(\omega_1)$ (step 440) and this step involves the process of N multiplications. The remainder of the time period still left from the previous data segment which is $T_{n+1}$ is then calculated (step 450) where in the details of the calculation is shown in FIG. 7. The function $e(K)$ which is $F(K) W_1^{-(k*k)/2} e^{j\omega_0 k}$ is calculated (step 460) which is then convoluted with $G(W_2) = W_2^{-[(k*k)/2 + k(N-1)/2 + (N-1)2/2]}$ (step 470**) and the result of the computation, i.e., $e(K)*W_2^{-[(k*k)/2 + k(N-1)/2 + (N-1)**2/2]}$ is multiplied to $W_2^{(p*p)/2}$ (step 480) in accordance to Equation 23 to obtain a sampled data $g_p$ at the new sampling rate. The data for the next segment is then inputted and the process is repeated again from the step 400. The data required for convolution computation such as W1, W2, and the smoothing window $H(\omega_1)$ may all stored in the database. It should be noted from the above description that the operational steps from steps 400 to 430 are included in FIG. 5 and the operation steps performed by the sampling converting means from the step 450 to 480 are included in FIGS. 6 and 7.

In summary, this invention discloses a data processing system capable of performing a sampling frequency conversion. The data processing system includes a data receiving means 105 for receiving a plurality of input data sampled at a first frequency. The data processing system 100 further includes a discrete transforming means 110 for performing a discrete transform on the input data at the first sampled frequency for transforming the input data to a discrete function in a second-variable-domain at the first sampling frequency wherein the discrete transform means being a discrete Fourier transform (DFT) means. The DFT transform means includes a first chirp transform evaluation means 200 which further includes a first multiplication means 210 for computing the product of $f(n)$ to $W_1^{-(n*n)/2}$ according to Equation 15, the first chirp transform evaluation means 200 further includes a first convolution means 220 for computing the convolution $e(n)*W_1^{-(n*n)/2}$ according to Equation 17, and the first chirp transform evaluation means further includes a second multiplication means 230 for computing the product of the convolution $e(n)*W_1^{-(n*n)/2}$ to $W_1^{(k*k)/2}$ to compute the value of $F(k)$ according to Equation 18. The data processing system further includes a convoluted inverse transform means 115 for inversely transforming the discrete function in a second-variable-domain back to the time domain at a second sampling frequency for converting the input data to a set of corresponding data sampled at the second sampling frequency wherein the convolute inverse transform means being a convolute inverse discrete Fourier transform (IDFT) transform means. The convoluted inverse transform means 115 further including a smoothing window means which being a symmetrical low pass filter for applying a smoothing window to the inverse transform. The convolute IDFT transform means further including a second chirp transform evaluation means 300 which further includes a third multiplication means 310 for computing the product of $\exp(jk\omega_0)$ to $W_2^{k*k/2}$ according to Equation 19, the second chirp transform evaluation means 300 further includes a second convolution means 320 for computing the convolution $e(K)*W_2^{-[(k*k)/2+(N-1)k/2]}$ according to Equation 20, and the second chirp transform evaluation means 300 further includes a fourth multiplication means 330 for computing the product of the convolution $e(K)*W_2^{-[(k*k)/2+(N-1)k/2]}$ to $W_2^{[-p*p/2+(n-1)**2/8]}$ to compute the values $g_p$ which is the data sampled at the second sampling frequency according to Equation 23.

Figure 9:
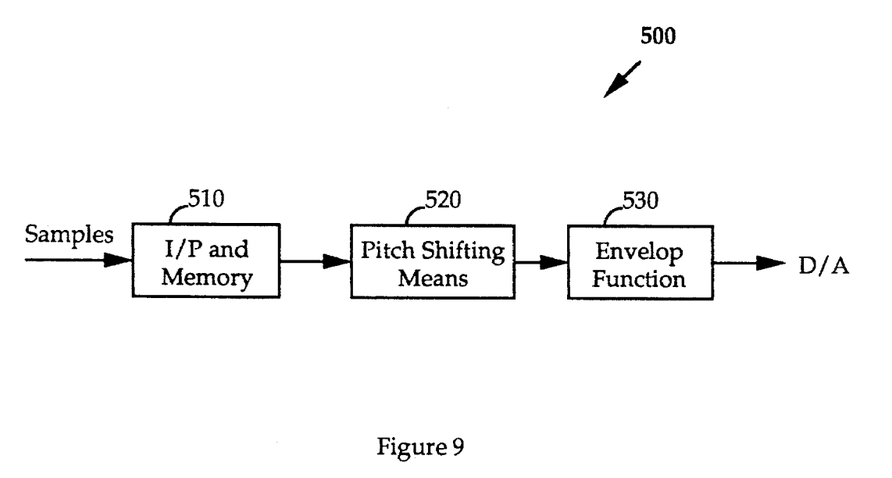
FIG. 9 shows a music synthesizer system which utilizes a sampling rate conversion system for pitch shift according to the present invention.

FIG. 9 shows a preferred embodiment of the present invention wherein a music synthesizing apparatus 500 is shown. The music synthesizing apparatus includes an input and memory module 510 to receive the sampled data at a first frequency. A pitch shifting means 520 is used which includes a sampling conversion apparatus of the present invention to shift the pitch. The data after been pitch shifted at a converted sampling frequency is then processed by an envelop function processing means 530 to generate a sequence of digital data to be further processed by a digital to analog converter. The synthesizer produced by a E-mu system Inc. in 1989 includes a product which has a Model number PROTEUS, uses a 16-bit multi-time branch digital sound module which utilizes a 1 gega instructions per second (GIPS) digital signal processor (DSP) chip which has 16 channels wherein each channel includes an adder and an multiplier with a processing speed of 64-MIPS by using the conventional Wittaker-Shanon interpolation technique. The processing speed of such as system can be reduced to approximately 5 MIPS per channel when the technique of the present invention is utilized. Furthermore, greater degree of pitch shift is allowed by simply selecting different $W_2$ vector and the functions $W_1$, $W_2$ and the smoothing window $H(w_1)$ can all be stored in a read only memory (ROM).

This invention also discloses a digital music synthesizer system 500. The synthesizer system 500 includes a data receiving and storage means 510 for receiving and temporary storing a plurality of input data sampled at a first frequency. The synthesizer system 500 further includes a pitch shifting means 520 which includes a discrete transforming means for performing a discrete transform on the input data at the first sampled frequency for transforming the input data to a discrete function in a second-variable-domain at the first sampling frequency. The pitch shifting means 520 further includes a convoluted inverse transform means for inversely transforming the discrete function in a second-variable-domain back to the time domain at a second sampling frequency for converting the input data to a set of corresponding data sampled at the second sampling frequency. The synthesizer system 500 further includes an envelop function means 530 for performing an enveloping processing on the data at the sampling frequency whereby the data at the second sampling frequency is ready for a digital to analog (D/A) conversion operation.

Other than the music synthesizing system as described above, the sampling conversion techniques of this invention can also be applied to a wide variety of fields. For example, the sampling rate conversion system can be used for downsample or up-sample operations in a speech signal processing programmer for speech compression. It can also be used in a frequency-multiplexed signal side-band system to improve the performance of a communication system. In a high definition television (HDTV) system, the techniques of the present invention can be applied to increase the resolution by replacing the DFT and IDFT by direct cosine transform (DCT) and inverse direct cosine transform (IDCT) to improve the graphic quality of the HDTV system. In addition to these specific examples, the method and system of this invention can be applied to many other digital signal processing systems where a sampling rate conversion operation is required.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A data processing system capable of performing a sampling frequency conversion comprising:

a data receiving means for receiving a plurality of input data sampled at a first sampling frequency;

a discrete transforming means for performing a discrete Fourier transform (DFT) on said input data sampled at said first sampling frequency for transforming the input data to a discrete function in a second-variable-domain at said first sampling frequency by performing:

$$F(k) = \sum_{n=0}^{N-1} f(n) W_1^{-nk} \quad (1\text{-}1)$$

where N being an integer representing the number of the sampled data $f(n)$, $W_1 = e^{j(2\pi/N)}$, and $k=-(n-1)/2, \ldots, (N-1)/2$; and a convoluted inverse transform means for performing a convolute inverse discrete Fourier transform (IDFT) transform for inversely transforming said discrete function in a second-variable-domain back to the time domain at a second sampling frequency for converting said input data to a set of corresponding data sampled at said second sampling frequency wherein said convolute inverse discrete Fourier transform (IDFT) transform being represented by:

$$g_p = (1/N) \sum_{k=-(N-1)/2}^{(N-1)/2} F(k) W_2^{pk} \quad (1\text{-}2)$$

where $W_2 = W_1^{(1/m)}$, and $m=\omega_1/\omega_2=f_2/f_1$ which being a ratio of said second sampling frequency for said sampled data $g_p$ to said first sampling frequency for said sampled data $f(n)$, wherein m being any positive real number while $n=0,1,2,\ldots,N-1$ and where p in Equations (1–2) being a total number of the sampled data at said second sampling frequency and $p=\{m(Tn+L)\}$ where $\{K\}$ representing an integer value of K which being smaller or equal to K and where L representing a length of a data segment which being a length of said DFT, and where $T_1=0$, and $$T_n = (1/m)\{m(T_{n-1}+N) - m(T_{n-1}+N)\} \quad (1\text{-}3)$$

which being a remaining interval of a (n+1)th data segment after re-sampling at said second sampling frequency.

2. The data processing system of claim 1 wherein:

said DFT transform means further includes a first chirp transform evaluation means for evaluating said DFT for computing the values of said DFT discrete function in a second-variable-domain at said first sampling frequency; and said convolute IDFT transform means further includes a second chirp transform evaluation means for evaluating said convoluted IDFT for computing the values of said data sampled at said second sampling frequency.

3. The data processing system of claim 2 wherein:

said DFT transform means which includes said first chirp transform evaluation means computes the values of said DFT discrete function in a second-variable-domain at said first sampling frequency by using an Equation represented by $$F(K) = W_1^{-k*k/2} \left[ \sum_{n=0}^{N-1} g_p W_1^{(1/2)(k-n)2} \right] \quad (5\text{-}1A)$$

$$= W_1^{-k*k/2}[g_p * W_1^{(n*n/2)}] \quad (5\text{-}1B)$$

where the "*" in Equation (5-1B) denotes a convolution operation and $k=-(n-1)/2 \ldots (n-1)/2$ where $F(K)$ corresponds to a convolution of said sampled data $g_p$ with a sequence $W_1^{(n*n/2)}$ for generating an output sequence which being indexed on an independent variable K; and said convolute IDFT transform means which includes said second chirp transform evaluation means computes the values of said data sampled at said second sampling frequency by utilizing an Equation represented as:

$$g_p = \left[ (1/N) \sum_{k=0}^{N-1} e(k) W_2^{-(1/2)(p-k)**2} W_2^{(1/2)(p-k)(N-1)} \right] \quad (5\text{-}2)$$

-continued $$W_2^{(1/8)(N-1)**2} \bigg] W_2^{-p*p/2}$$

where said output sequence F(k) being re-sampled to become said sampled data $g_p$.

4. The data processing system of claim 3 wherein:

said DFT transform means including said first chirp transform evaluation means further includes a first multiplication means for computing the product of f(n) to $W_1^{-(n*n)/2}$ according to an Equation represented by $$g_p = f(n)W_1^{-(n*n)/2} \qquad (6\text{-}1)$$

said first chirp transform evaluation means further includes a first convolution means for computing the convolution $e(n)*W_1^{-(n*n)/2}$ according to an Equation represented by:

$$e(n) * W_1^{-n*n/2} = \sum_{n=0}^{N-1} e(n) W_1^{(1/2)(k-n)2} \qquad (6\text{-}2)$$

and said first chirp transform evaluation means further includes a second multiplication means for computing the product of said convolution $e(n)*W_1^{-(n*n)/2}$ to $W_1^{(k*k)/2}$ to compute the value of F(k) according to an Equation represented by:

$$F(K) = \left[ \sum_{n=0}^{N-1} f_n W_1^{-n*n/2} W_1^{(1/2)(k-n)2} \right] W_1^{-k*k/2} \qquad (6\text{-}3)$$

said convolute IDFT transform means including said second chirp transform evaluation means further includes a third multiplication means for computing the product of $\exp(jk\omega_0)$ to $W_2^{k*k/2}$ according to an Equation represented by:

$$g_p = (1/N) \sum_{k=-(N-1)/2}^{(N-1)/2} W_2^{(k*K)/2} F(k) W_2^{(1/2)(p-k)(p-k)} W_2^{-p*p/2} \qquad (6\text{-}4)$$

said second chirp transform evaluation means further includes a second convolution means for computing the convolution $e(K)*W_2^{-[(k*k)/2+(N-1)k/2]}$ according to an Equation represented by:

$$\begin{aligned} \underline{e}(k) * W_2^{-k*k/2} &= (1/N) \sum_{k=-(n-1)/2}^{(N-1)/2} e(k) W_2^{(1/2)(p-k)2} \qquad (6\text{-}5) \\ &= (1/N) \sum_{k=-(n-1)/2}^{(N-1)/2} e(k) W_2^{(1/2)(p-k-(n-1)/2)2} \end{aligned}$$

and said second chirp transform evaluation means further includes a fourth multiplication means for computing the product of said convolution $e(K)*W_2^{-[(k*k)/2+(N-1)k/2]}$ to $W_2^{[-p*p/2+(n-1)**2/8]}$ to compute the values $g_p$ which is the data sampled at said second sampling frequency according to said Equation (5-2).

5. A data processing system capable of performing a sampling frequency conversion comprising:

a data receiving means for receiving a plurality of input data sampled at a first sampling frequency;

a discrete transforming means for performing a discrete transform on said input data sampled at said first sampling frequency for transforming the input data to a discrete function in a second-variable-domain at said first sampling frequency;

a convoluted inverse transform means for inversely transforming said discrete function in a second-variable-domain back to the time domain at a second sampling frequency for converting said input data to a set of corresponding data sampled at said second sampling frequency; and said convoluted inverse transform means for inversely transforming said discrete function in a second-variable-domain back to the time domain at a second sampling frequency further includes a smoothing window means for applying a smoothing window to said inverse transform.

6. The data processing system of claim 5 wherein:

said smoothing window means of said convoluted inverse transform means being a symmetric low pass filter.

7. A data processing system capable of performing a sampling frequency conversion comprising:

a data receiving means for receiving a plurality of input data sampled at a first sampling frequency;

a discrete transforming means for performing a discrete transform on said input data sampled at said first sampling frequency for transforming the input data to a discrete function in a second-variable-domain at said first sampling frequency wherein said discrete transform means being a discrete Fourier transform (DFT) means;

said DFT transform means including a first chirp transform evaluation means which further includes a first multiplication means for computing the product of f(n) to $W_1^{-(n*n)/2}$ according to an Equation represented by $$g_p = f(n)W_1^{-(n*n)/2} \qquad (9\text{-}1)$$

said first chirp transform evaluation means further includes a first convolution means for computing the convolution $e(n)*W_1^{-(n*n)/2}$ according to an Equation represented by:

$$e(n) * W_1^{-n*n/2} = \sum_{n=0}^{N-1} e(n) W_1^{(1/2)(k-n)2} \qquad (9\text{-}2)$$

and said first chirp transform evaluation means further includes a second multiplication means for computing the product of said convolution $e(n)*W_1^{-(n*n)/2}$ to $W_1^{(k*k)/2}$ to compute the value of F(k) according to an Equation represented by:

$$F(K) = \left[ \sum_{n=0}^{N-1} f_n W_1^{-n*n/2} W_1^{(1/2)(k-n)2} \right] W_1^{-k*k/2} \qquad (9\text{-}3)$$

a convoluted inverse transform means for inversely transforming said discrete function in a second-variable-domain back to the time domain at a second sampling frequency for converting said input data to a set of corresponding data sampled at said second sampling frequency wherein said convolute inverse transform means being a convolute inverse discrete Fourier transform (IDFT) transform means;

said convoluted inverse transform means further including a smoothing window means which being a symmetrical low pass filter for applying a smoothing window to said inverse transform;

said convolute IDFT transform means further including a second chirp transform evaluation means which further includes a third multiplication means for computing the product of $\exp(jk\omega_0)$ to $W_2^{k*k/2}$ according to an Equation represented by:

$$g_p = (1/N) \sum_{k=-(N-1)/2}^{(N-1)/2} W_2^{(k*K)/2} F(k) W_2^{(1/2)(p-k)(p-k)} W_2^{-p*p/2} \qquad (9\text{-}4)$$

said second chirp transform evaluation means further includes a second convolution means for computing the convolution $e(K)*W_2^{-[(k*k)/2+(N-1)k/2]}$ according to an Equation represented by:

$$\underline{e}(k) * W_2^{-k*k/2} = (1/N) \sum_{k=-(n-1)/2}^{(N-1)/2} \underline{e}(k) W_2^{(1/2)(p-k)2} \quad (9\text{-}5)$$

$$= (1/N) \sum_{k=-(n-1)/2}^{(N-1)/2} e(k) W_2^{[(1/2)(p-k-(n-1)/2]2}$$

and said second chirp transform evaluation means further includes a fourth multiplication means for computing the product of said convolution $e(K)*W^{2-[(k*k)/2+(N-1)k/2]}$ to $W_2^{[-p*p/2+(n-1)**2/8]}$ to compute the values $g_p$ which is the data sampled at said second sampling frequency according to Equation 23 an Equation represented as:

$$g_p = \left[ (1/N) \sum_{k=0}^{N-1} e(k) W_2^{-(1/2)(p-k)**2} W_2^{(1/2)(p-k)(N-1)} \right. \quad (9\text{-}6)$$

$$\left. W_2^{(1/8)(N-1)**2} \right] W_2^{-p*p/2}$$

8. A method for sampling rate conversion comprising the steps of:

(a) receiving a plurality of input data sampled at a first sampling frequency;

(b) applying a DFT at said first sampling frequency to said input data to obtain a plurality of frequency-domain discrete functions by performing:

$$F(k) = \sum_{n=0}^{N-1} f(n) W_1^{nk} \quad (10\text{-}1)$$

where N being an integer representing the number of the sampled data f(n), $W_1 = e^{j(2\pi/N)}$, and $k=-(n-1)/2, \ldots, (N-1)/2$; and (c) applying a convoluted IDFT to transform said frequency-domain discrete functions at said first sampling frequency to a set of corresponding time-domain data at a second sampling frequency wherein said convolute inverse discrete Fourier transform (IDFT) transform being represented by:

$$g_p = (1/N) \sum_{k=-(N-1)/2}^{(N-1)/2} F(k) W_2^{pk} \quad (10\text{-}2)$$

where $W_2 = W_1^{(1/m)}$, and $m=\omega_1/\omega_2=f_2/f_1$ being a ratio of said second sampling frequency for said sampled data $g_p$ to said first sampling frequency for said sampled data f(n), wherein m being any positive real number while $n=0,1,2,\ldots,N-1$ and where p in Equations (1–2) being a total number of the sampled data at said second sampling frequency and $p=\{m(Tn+L)\}$ where $\{K\}$ representing an integer value of K which being smaller or equal to K and where L representing a length of a data segment which being a length of said DFT, and where $T_1=0$, and $$T_n=(1/m)\{m(T_{n-1}+N)-m(T_{n-1}+N)\} \quad (10\text{-}3)$$

which being a remaining interval of a (n+1)th data segment after re-sampling at said second sampling frequency.

9. A method for sampling rate conversion comprising the steps of:

(a) receiving a plurality of input data sampled at a first frequency;

(b) performing a discrete transform on said input data at said first sampled frequency for transforming the input data to a discrete function in a second-variable-domain at said first sampling frequency wherein said discrete transform being a discrete Fourier transform (DFT) performing a first chirp transform evaluation by first computing the product of f(n) to $W_1^{-(n*n)/2}$ according to an Equation represented by:

$$g_p = f(n) W_1^{-(n*n)/2} \quad (12\text{-}1)$$

then computing the convolution $e(n)*W_1^{-(n*n)/2}$ according to an Equation represented by:

$$e(n) * W_1^{n*n/2} = \sum_{n=0}^{N-1} e(n) W_1^{(1/2)(k-n)2} \quad (12\text{-}2)$$

and furthermore computing the product of said convolution $e(n)*W_1^{-(n*n)/2}$ to $W_1^{(k*k)/2}$ to compute the value of F(k) according to an Equation represented by:

$$F(K) = \left[ \sum_{n=0}^{N-1} f_n W_1^{-n*n/2} W_1^{(1/2)(k-n)2} \right] W_1^{-k*k/2} \quad (12\text{-}3)$$

(c) inversely transforming said discrete function in said second-variable-domain back to the time domain at a second sampling frequency for converting said input data to a set of corresponding data sampled at said second sampling frequency wherein said convolute inverse transform being a convolute inverse discrete Fourier transform (IDFT) transform further performing a smoothing window operation by using a symmetrical low pass filter for applying a smoothing window to said inverse transform; and (d) said convolute IDFT transform step further applying a second chirp transform evaluation by first computing the product of $\exp(jk\omega_0)$ to $W_2^{k*k/2}$ according to an Equation represented by:

$$g_p = (1/N) \sum_{k=-(N-1)/2}^{(N-1)/2} W_2^{(K*K)/2} F(k) W_2^{(1/2)(p-k)(p-k)} W_2^{p*p/2} \quad (12\text{-}4)$$

then computing the convolution $e(K)*W_2^{-[(k*k)/2+(N-1)k/2]}$ an Equation represented by:

$$\underline{e}(k) * W_2^{-k*k/2} = (1/N) \sum_{k=-(n-1)/2}^{(N-1)/2} \underline{e}(k) W_2^{(1/2)(p-k)2} \quad (12\text{-}5)$$

$$= (1/N) \sum_{k=-(n-1)/2}^{(N-1)/2} e(k) W_2^{[(1/2)(p-k-(n-1)/2]2}$$

and further includes a fourth multiplication means for computing the product of said convolution $e(K)*W_2^{-[(k*k)/2+(N-1)k/2]}$ to $W_2^{[-p*p/2+(n-1)**2/8]}$ to compute the values $g_p$ which is the data sampled at said second sampling frequency according to an Equation represented as:

$$g_p = \left[ (1/N) \sum_{k=0}^{N-1} e(k) W_2^{-(1/2)(p-k)**2} W_2^{(1/2)(p-k)(N-1)} \right. \quad (12\text{-}6)$$

$$\left. W_2^{(1/8)(N-1)**2} \right] W_2^{-p*p/2}$$

where said output sequence F(k) being re-sampled to become said sampled data $g_p$.

10. A digital music synthesizer system comprising:

a data receiving and storage means for receiving and temporary storing a plurality of input data sampled at a first sampling frequency;

a pitch shifting means including a discrete transforming means for performing a discrete transform on said input data at said first sampled frequency for transforming the input data to a discrete function in a second-variable-domain at said first sampling frequency wherein said discrete transform being a discrete Fourier transform (DFT) on said input data sampled at said first sampling frequency for transforming the input data to a discrete function in a second-variable-domain at said first sampling frequency by performing:

$$F(k) = \sum_{n=0}^{N-1} f(n) W_1^{nk} \quad (13\text{-}1)$$

where N being an integer representing the number of the sampled data f(n), $W_1 = e^{j(2\pi/N)}$, and $k = -(n-1)/2, \ldots, (N-1)/2$; and said pitch shifting means further including a convoluted inverse transform means performing a convolute inverse discrete Fourier transform (IDFT) transform for inversely transforming said discrete function in a second-variable-domain back to the time domain at a second sampling frequency for converting said input data to a set of corresponding data sampled at said second sampling frequency wherein said convolute inverse discrete Fourier transform (IDFT) transform being represented by:

$$g_p = (1/N) \sum_{k=-(N-1)/2}^{(N-1)/2} F(k) W_2^{pk} \quad (13\text{-}2)$$

where $W_2 = W_1^{(1/m)}$, and $m = \omega_1/\omega_2 = f_2/f_1$ being a ratio of said second sampling frequency for said sampled data $g_p$ to said first sampling frequency for said sampled data f(n), wherein m being any positive real number while $n = 0, 1, 2, \ldots, N-1$ and where p in Equations (1-2) being a total number of the sampled data at said second sampling frequency and $p = \{m(Tn+L)\}$ where $\{K\}$ representing an integer value of K which being smaller or equal to K and where L representing a length of a data segment which being a length of said DFT, and where $T_1 = 0$, and $$T_n = (1/m)\{m(T_{n-1}+N) - m(T_{n-1}+N)\} \quad (1\text{-}3)$$

which being a remaining interval of a (n+1)th data segment after re-sampling at said second sampling frequency; and an envelop function means for performing an enveloping processing on said data at said sampling frequency whereby said data at said second sampling frequency is ready for a digital to analog conversion operation.

* * * * *